United States Patent [19]
Bithell et al.

[11] Patent Number: 4,624,728
[45] Date of Patent: Nov. 25, 1986

[54] PIN LIFT PLASMA PROCESSING

[75] Inventors: Roger M. Bithell, Novato; Harry Slomowitz, Walnut Creek, both of Calif.

[73] Assignee: Tegal Corporation, Novato, Calif.

[21] Appl. No.: 743,341

[22] Filed: Jun. 11, 1985

[51] Int. Cl.⁴ .............. B44C 1/22; C03C 15/00; H01L 21/306; C23F 1/02
[52] U.S. Cl. .................... 156/345; 156/643; 156/646; 204/298; 269/53
[58] Field of Search ............ 156/345, 643, 646; 204/298; 118/729, 50.1, 620; 269/21, 53, 54.5

[56] References Cited
U.S. PATENT DOCUMENTS 4,547,247 10/1985 Warenback et al. .............. 156/345
4,551,192 11/1985 DiMilia et al. ..................... 156/345

Primary Examiner—William A. Powell
Attorney, Agent, or Firm—Paul F. Wille

[57] ABSTRACT

A wafer is supported on pins within a plasma reactor, allowing the plasma to act on both sides of the wafer. Various processes are disclosed for pins-up and pins-down condition. If conductive pins are used, they are preferably flattened. The wafer is preferably biased negatively with respect to the plasma.

5 Claims, 5 Drawing Figures

U.S. Patent  Nov. 25, 1986  4,624,728
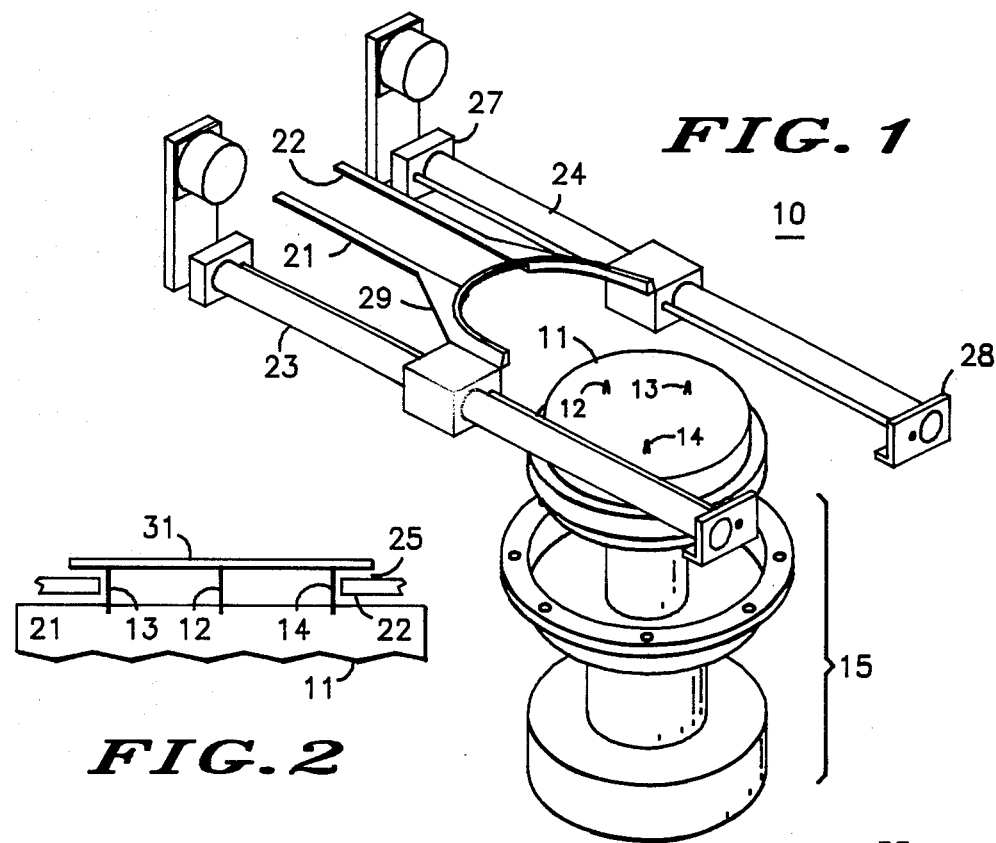
FIG. 1
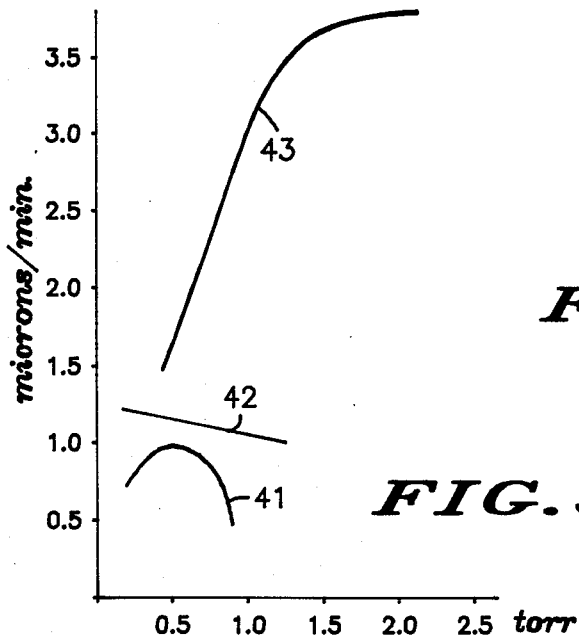
FIG. 2
FIG. 3
FIG. 4
FIG. 5

PIN LIFT PLASMA PROCESSING

BACKGROUND

This invention relates to glow discharge or plasma reactors and, in particular, to parallel plate reactors.

Initially, in the semiconductor industry, plasma reactors were used for removing photoresist after it had been used to pattern a wafer. Subsequently, plasma reactors became used for a variety of processes formerly carried out with so-called wet chemistries. In addition to these etch processes, deposition processes were also developed. It has remained that the photoresist removal or "stripping" is not so easily done as one might imagine. Photoresist is typically applied to a central spot on a wafer which is then spun to spread the photoresist into a thin layer covering the entire surface of the wafer. Since the vacuum chuck, which holds the wafer during the spin operation, does not cover the entire backside of the wafer, some resist vapors condense on the exposed portions of the backside of the wafer. In addition, a dirty resist spinner chuck will leave a resist residue on the backside of the wafer.

Batch processes support a plurality of wafers in a boat so that there is access to both sides of the wafer, except for where the wafers rest on the rails of the boat. In parallel plate reactors, the wafer rests on an electrode, shielding the backside of the wafer. While one possibility is to add a backside strip to the process sequence, this is undesirable. In general, it is desired to process wafers with as few steps as possible. This not only increases the number of wafers which can be processed per hour, it also reduces handling of the wafers and the chance for breakage and contamination.

At the same time that these process changes were evolving, device structures were also evolving. Specifically, devices were becoming smaller, not only in area but also in thickness. As the layers used to construct a device become thinner, processing become more difficult. Uniformity across a semiconductor wafer is an imperative if all of the devices on the wafer are to have the same operating characteristics. Wafers, meanwhile, are increasing in diameter, making uniformity more difficult to obtain over ever increasing areas.

Another problem which develops as layers become thinner is susceptibility to radiation damage, e.g. what are known as C-V or threshold shift and gate rupture. Thinner layers are less tolerant of radiation than thicker layers. The radiation developed in the plasma is composed of ions, electrons and photons.

The exact constituents of the radiation depend on the gas(es) supplied, the pressure within the reactor, the applied RF power, and the bias applied to the wafer or induced in the wafer from the applied RF power. In terms of charged particles, i.e. the ions in the plasma, the damage depends upon the voltage of the wafer relative to the plasma. Voltages on the order of a few hundred volts are not uncommon. The plasma reactor thus becomes a miniature accelerator. The applied RF power provides a means for exciting the atoms. When the ions revert to a lower energy state, they radiate photons. While the wavelength of the photons can be anywhere in the "light" spectrum, it is frequently in the range of what is known as short ultraviolet, i.e. it is highly actinic.

In view of the of the foregofng, it is therefore an object of the present invention to provide an improved wafer stripping process.

Another object of the present invention is to provide improved plasma processes in which the chance for radiation damage is reduced.

A further object of the present invention is to provide improved plasma processing wherein the plasma has access to both sides of a wafer.

Another object of the present invention is to reduce the number of steps in the processing of semiconductor wafers.

SUMMARY

The foregofng objects are achieved in the present invention in which the lower electrode of a parallel plate reactor comprises pins for raising the wafer during processing thereof. The wafer is then immersed in the glow discharge, which has access to both sides of the wafer. While etch rates are reduced if the pins are insulated from the lower electrode, radiation damage may also be reduced, despite the longer etch time. For conductive pins, electrical contact to the wafer is improved.

BRIEF DESCRIPTION OF THE DRAWINGS

A more complete understanding of the present invention can be obtained by considering the following detailed description in conjunction with the accompanying drawings, in which:

FIG. 1 illustrates a wafer transport mechanism employing wafer pin lifts.

FIG. 2 illustrates a pin lift mechanism in cross-section.

FIG. 3 illustrates a detail of a pin in accordance with the present invention.

FIG. 4 illustrates an alternative embodiment of a pin lift mechanism in accordance with the present invention.

FIG. 5 illustrates etch results from the present invention.

DETAILED DESCRIPTION

FIG. 1 illustrates a pin lift mechanism as part of a wafer transport system in which wafers are unloaded from a cassette and positioned over the lower electrode in a parallel plate plasma reactor. In particular, transport mechanism 10 comprises lower electrode 11 having pins 12-14 positioned therein. Both lower electrode 11 and pins 12-14 are separately movable by a suitable elevator mechanism 15. That is, lower electrode 11 can be raised and lowered and pins 12-14 can be separately raised and lowered to any desired height. Positioned above electrode 11 are tines 21 and 22 which are attached to rails 23 and 24 by suitable bearings. Tines 21 and 22 are connected to the bearings by arcuate member 29, which provides clearance for electrode 11 in the raised position.

In operation, tines 21 and 22 are moved to the left, as illustrated in FIG. 1, to pick up a wafer from a cassette. The tines are then moved to the right, as illustrated in FIG. 1, thereby holding the wafer in position above electrode 11, which had previously been lowered. Pins 12-14 are extended from electrode 11 to lift the wafer off tines 21 and 22. Tines 21 and 22 are then moved back to the left so that the pins may be lowered placing the wafer on electrode 11. Tines 21 and 22 are then moved to the left so that arcuate number 29 is positioned above and to the left of electrode 11 to provide clearance for the electrode and the wafer. Electrode 11, with the wafer thereon, is then raised to sealingly engage a plasma reactor chamber, thereby closing it. Arcuate number 29 also provides the function of supporting the wafer, if necessary, for pick up by a second set of tines to the right of transport mechanism 10.

As thus described, the use of pins within electrode 11 have served only to facilitate the transportation of wafers through a plasma system. In accordance with the present invention, pins of various kinds are used to raise the wafer while within the sealed reactor chamber so that the wafer is immersed in a glow discharge.

FIG. 2 illustrates a side view of the electrode, pins, and tines. As illustrated in FIG. 2, pins 12-14 are in a fully raised position, lifting wafer 31 off tines 21 and 22. Within a reactor chamber, pins 12-14 can raise wafer 31 a similar distance or any lesser distance from electrode 11. Except for when wafer 31 is extremely close to electrode 11, there is little interaction or coupling between wafer 31 and electrode 11. Thus, one has some flexibility in positioning the wafer, for example, giving consideration to other parameters such as gas flow across the wafer. Coupling to the wafer is controlled primarily by the conductivity or dielectric constant of pins 12-14. If pins 12-14 are conductive, wafer 31 is maintained at essentially the same potential as electrode 11. This configuration is useful, for example, for the stripping of photoresist. In particular, by raising wafer 31 by means of pins 12-14, the wafer 31 becomes immersed in the glow discharge which can then be used to etch photoresist adjacent rim 25 on the underside of wafer 31. Thus, one obtains, in a parallel plate reactor, a single photoresist stripping step.

FIG. 3 illustrates a preferred embodiment of a pin in accordance with the present invention. In particular, pin 30 preferably comprises a rounded or blunted tip 33 which engages the semiconductor wafer. If pin 30 comprises conductive material the rounded or flattened portion 33 enables one to obtain adequate electrical contact with the wafer. Even if pin 30 comprises insulating material such as quartz, it is preferred insulator, it is understood by those of skill in the art that pin 30 need not comprise a solid piece of conductive material or a solid piece of insulating material. One could provide, for example, a glass or plastic coating on a conductive pin to provide insulation between the conductive core and the semiconductor wafer. Conversely, one could provide an insulating pin having a conductive layer on the outside thereof. Alternatively, as illustrated by dashed line 32, one can construct pin 30 in two pieces which are then fused or fastened together. For example, the upper end of pin 30 can comprise quartz while the lower end comprises aluminum.

FIG. 4 illustrates still another alternative enabling one a wide choice of materials for the pins used. In particular, pin 34, having blunted tip 35 is separated from electrode 11 by sleeve 36 of suitable material. For example, it may be desirable to provide a conductive pin 34 separated from electrode 11 by insulating sleeve 36 which can comprise, for example, a material non reactive to the plasma, e.g. ceramic or quartz. Alternatively, pin 34 can comprise quartz, for example, and sleeve 36 comprise a suitable bearing and sealing material to enable pin 34 to be raised and lowered a number of times without generating excessive particles by abrading electrode 11, which typically comprises aluminum.

FIG. 5 illustrates the performance of the present invention in terms of etch rate vs. pressure in torr. The results illustrated were obtained in a parallel plate, radial flow reactor using oxygen to etch a photoresist layer on a five inch (125 mm) wafer. The applied RF comprised 500 watts at 13.56 mhz.

Curve 41 illustrates the etch rate vs. pressure using quartz pins in a pins-up mode. Curve 42 was obtained using aluminum pins in a pins-up mode. Curve 43 was obtained from a pins-down mode operation. The loading effect is lower for the pins-up mode than for the pins-down mode. For example, the etch rate for a four inch wafer in the pins-down mode is typically 3-4 microns/minute, whereas the etch rate for a six inch wafer in the pins-down mode is typically 1.7-2.2 microns/minute. That is, the area increased 225% and the etch rate decreased 44%. In the pins-up mode, on aluminum pins, the etch rate decreased only 13% going from a four inch wafer to a six inch wafer.

There is thus provided by the present invention an improved plasma process in which access to both sides of the wafer is obtained through the use of support pins extending from the lower electrode. By choice of material for the pins, a variety of processes are enabled. In addition, radiation damage to the wafer may be reduced.

Having thus described the invention it will be apparent to those of skill in the art that various modifications can be made within the spirit and scope of the present invention. For example, the finish used on the tip of the pins is not critical so long as conductive pins are not pointed. Thus, for example the tips may be flattened or rounded. If flattened, it is preferred that there be no square corner at the tip thereby avoiding an edge which may damage the wafer. The number and location of the pins is a matter of choice. It is understood that, absent some other support, at least three pins are necessary to support the wafer. While illustrated in FIG. 1 as part of a wafer transport, it is understood that the support pins in accordance with the present invention can be used with any plasma electrode, whether fixed, movable, or part of a greater wafer transport system.

We claim:

1. A parallel plate parallel reactor comprising:
   a lower electrode for receiving a semiconductor wafer;
   means for causing a glow discharge within said reactor, adjacent said lower electrode;
   a plurality of pins within said lower electrode for engaging said semiconductor wafer; and
   control means for extending said pins during said plasma discharge to lift said wafer into said discharge and to provide access to both sides of said wafer for said discharge.

2. The apparatus as set forth in claim 1 wherein said pins electrically disconnect said wafer from said electrode.

3. The apparatus as set forth in claim 1 wherein said pins electrically connect said wafer and said electrode.

4. The apparatus as set forth in claim 2 wherein said electrode comprises insulating sleeves surrounding said pins.

5. The apparatus as set forth in claim 1 wherein said electrode comprises sleeve means surrounding said pins.

* * * * *